United States Patent
Inumiya

(10) Patent No.: US 10,381,471 B2
(45) Date of Patent: Aug. 13, 2019

(54) SEMICONDUCTOR DEVICE AND MANUFACTURING METHOD

(71) Applicant: KABUSHIKI KAISHA TOSHIBA, Minato-ku, Tokyo (JP)

(72) Inventor: Seiji Inumiya, Tokyo (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 15/462,363

(22) Filed: Mar. 17, 2017

(65) Prior Publication Data

US 2018/0069112 A1 Mar. 8, 2018

(30) Foreign Application Priority Data

Sep. 2, 2016 (JP) .................. 2016-171415

(51) Int. Cl.
| | |
|---|---|
| *H01L 29/778* | (2006.01) |
| *H01L 29/66* | (2006.01) |
| *H01L 29/417* | (2006.01) |
| *H01L 21/02* | (2006.01) |
| *H01L 29/51* | (2006.01) |
| *H01L 29/423* | (2006.01) |
| *H01L 29/20* | (2006.01) |

(52) U.S. Cl.
CPC ...... *H01L 29/7787* (2013.01); *H01L 21/0254* (2013.01); *H01L 29/41758* (2013.01); *H01L 29/518* (2013.01); *H01L 29/66462* (2013.01); *H01L 29/7786* (2013.01); *H01L 29/2003* (2013.01); *H01L 29/41766* (2013.01); *H01L 29/4236* (2013.01); *H01L 29/513* (2013.01)

(58) Field of Classification Search
CPC .......... H01L 29/7787; H01L 29/41758; H01L 29/66462; H01L 21/0254
USPC ........................................................ 257/194
See application file for complete search history.

(56) References Cited

U.S. PATENT DOCUMENTS

| | | | |
|---|---|---|---|
| 7,859,021 B2 | 12/2010 | Kaneko | |
| 2010/0025730 A1* | 2/2010 | Heikman | ............ H01L 29/7787 257/194 |

(Continued)

FOREIGN PATENT DOCUMENTS

| | | |
|---|---|---|
| JP | 2015-211151 A | 11/2015 |
| JP | 2016-072358 A | 5/2016 |

*Primary Examiner* — Tong-Ho Kim
(74) *Attorney, Agent, or Firm* — Foley & Lardner LLP

(57) ABSTRACT

A semiconductor device includes a first nitride semiconductor layer, a second nitride semiconductor layer provided on the first nitride semiconductor layer, a gate electrode, an aluminum oxynitride layer provided between the gate electrode and the second nitride semiconductor layer, a first electrode electrically connected to the first nitride semiconductor layer, a second electrode electrically connected to the first nitride semiconductor layer, a first aluminum nitride layer provided on the second nitride semiconductor layer between the first electrode and the aluminum oxynitride layer, and a second aluminum nitride layer provided on the second nitride semiconductor layer between the second electrode and the aluminum oxynitride layer. The second nitride semiconductor layer has an electron affinity lower than that of the first nitride semiconductor layer. A second electrode sandwiches the gate electrode together with the first electrode.

2 Claims, 7 Drawing Sheets

(56) References Cited

U.S. PATENT DOCUMENTS

| | | | |
|---|---|---|---|
| 2014/0124789 A1* | 5/2014 | Ramdani | H01L 21/28264 257/76 |
| 2015/0053921 A1* | 2/2015 | Cheng | H01L 21/28264 257/20 |
| 2016/0225857 A1* | 8/2016 | Saito | H01L 29/513 |
| 2016/0276473 A1 | 9/2016 | Edwards et al. | |

* cited by examiner

SEMICONDUCTOR DEVICE AND MANUFACTURING METHOD

CROSS REFERENCE TO RELATED APPLICATION

This application claims the benefit of and priority to the prior Japanese Patent Application No. 2016-171415 filed on Sep. 2, 2016 in Japan, the entire contents of which are incorporated herein by reference.

FIELD

Embodiments described herein relate generally to a semiconductor device and a manufacturing method.

BACKGROUND

In realizing a low on-resistance of a device in operation and a high speed switching, a high electron mobility transistor (HEMT) using a group III-V compound semiconductor in which a two-dimensional electron gas (2DEG) may be formed in a channel layer. HEMT having 2DEG in the channel layer under a gate electrode may have a normally-on characteristic such that a current flows between a source and a drain without being applied with a voltage to the gate. However, improvements in such configuration of HEMT remain desired.

SUMMARY

In some embodiments according to one aspect, a semiconductor device may include a first nitride semiconductor layer, a second nitride semiconductor layer, a gate electrode, an aluminum oxynitride layer, a first electrode, a second electrode, a first aluminum nitride layer, and a second aluminum nitride layer. The second nitride semiconductor layer may be provided on the first nitride semiconductor layer and having an electron affinity lower than an electron affinity of the first nitride semiconductor layer. The aluminum oxynitride layer may be provided between the gate electrode and the second nitride semiconductor layer. The first electrode may be electrically connected to the first nitride semiconductor layer. The second electrode may be electrically connected to the first nitride semiconductor layer and may sandwich the gate electrode together with the first electrode. The first aluminum nitride layer may be provided on the second nitride semiconductor layer between the first electrode and the aluminum oxynitride layer. The second aluminum nitride layer may be provided on the second nitride semiconductor layer between the second electrode and the aluminum oxynitride layer.

In some embodiments according to another aspect, a manufacturing method of a semiconductor device may include forming a first nitride semiconductor layer. On the first nitride semiconductor layer, a second nitride semiconductor layer having an electron affinity lower than an electron affinity of a first nitride semiconductor layer may be formed. An aluminum nitride layer on the second nitride semiconductor layer may be formed. An aluminum oxynitride layer may be formed by selectively oxidizing a portion of the aluminum nitride layer. A gate electrode may be formed on the aluminum oxynitride layer.

Other aspects and embodiments of the disclosure are also encompassed. The foregoing summary and the following detailed description are not meant to restrict the disclosure to any particular embodiment but are merely meant to describe some embodiments of the disclosure.

DETAILED DESCRIPTION

Figure 1:
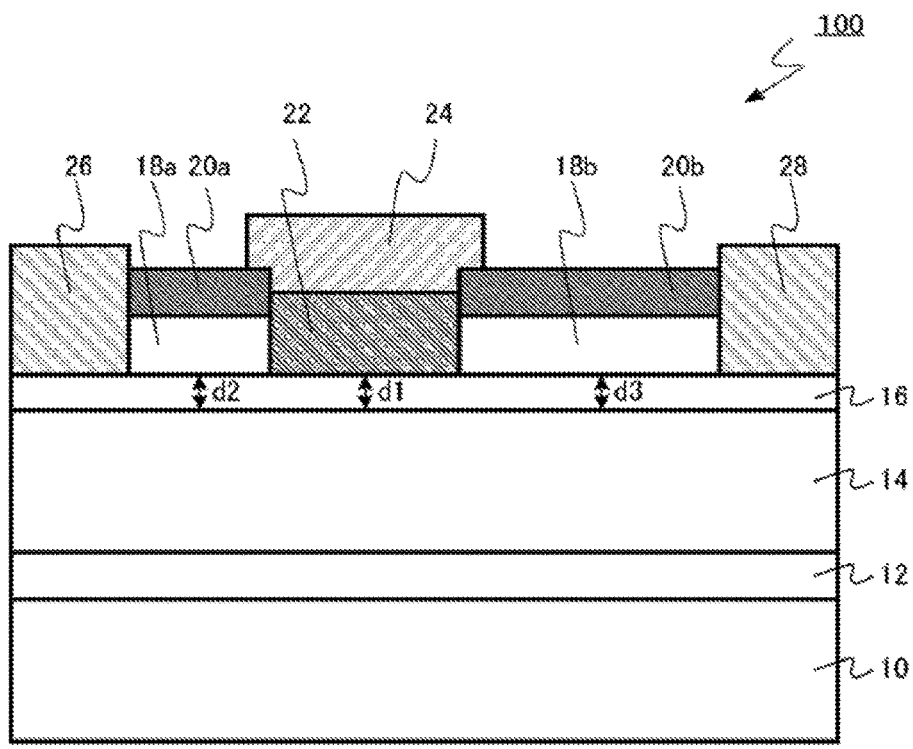
FIG. 1 is a schematic cross-sectional view of a semiconductor device according to some embodiments.

In some embodiments, a configuration which current flows between a source and a drain of devices including HEMT at the time of starting up the devices is not desirable for a variety of applications. In some embodiments, HEMT can have a normally-off characteristic such that the current does not flow between the source and the drain without being applied with the voltage to the gate.

One embodiment of the present disclosure provides a semiconductor device and a manufacturing method which are capable of realizing a normally-off characteristic.

According to some embodiments, a semiconductor device may include a first nitride semiconductor layer, a second nitride semiconductor layer provided on the first nitride semiconductor layer and having an electron affinity lower than that of the first nitride semiconductor layer, a gate electrode, an aluminum oxynitride layer provided between the gate electrode and the second nitride semiconductor layer, a first electrode electrically connected to the first nitride semiconductor layer, a second electrode electrically connected to the first nitride semiconductor layer and sandwiching the gate electrode together with the first electrode, a first aluminum nitride layer provided on the second nitride semiconductor layer between the first electrode and the aluminum oxynitride layer, and a second aluminum nitride layer provided on the second nitride semiconductor layer between the second electrode and the aluminum oxynitride layer.

In the following description, corresponding devices, components and the like may be referred to by same reference signs.

In the following description, the term "undoped" refers to an impurity concentration is not more than about $1\times10^{15}$ cm$^{-3}$.

In the following description, an upward direction as shown in the drawings is referred to as "up" and a downward direction as shown in the drawing is referred to as "down" in order to indicate a positional relation of components and the like. In the following description, the terms "up" and "down" do not necessarily indicate a relation with a direction of gravity. In the description of some embodiments, an element provided "on" another element can encompass cases where the former element is directly on (e.g., in physical contact with) the latter element, as well as cases where one or more intervening elements are located between the former element and the latter element.

A semiconductor device according to some embodiments may include a first nitride semiconductor layer, a second nitride semiconductor layer having the electron affinity lower than that of the first nitride semiconductor layer, a gate electrode, an aluminum oxynitride layer provided between the gate electrode and the second nitride semiconductor layer, a first electrode electrically connected to the first nitride semiconductor layer, a second electrode electrically connected to the first nitride semiconductor layer and sandwiching the gate electrode with the first electrode, a first aluminum nitride layer provided on the second nitride semiconductor layer between the first electrode and the aluminum oxynitride layer, and a second aluminum nitride layer provided on the second nitride semiconductor layer between the second electrode and the aluminum oxynitride layer.

FIG. 1 is a schematic cross-sectional view of a semiconductor device according to some embodiments. In some embodiments, the semiconductor device may include HEMT using a group III-V semiconductor.

In some embodiments, as shown in FIG. 1, a HEMT 100 includes a substrate 10, a buffer layer 12, a channel layer 14 (as the first nitride semiconductor layer), a barrier layer 16 (as the second nitride semiconductor layer), a first aluminum nitride layer 18a, a second aluminum nitride layer 18b, a first cap layer 20a, a second cap layer 20b, an aluminum oxynitride layer 22, a gate electrode 24, a source electrode 26 (as the first electrode), and a drain electrode 28 (as the second electrode). In some embodiments, the first aluminum nitride layer 18a and the second aluminum nitride layer 18b may be included in an aluminum nitride layer 18 (see FIG. 4). In some embodiments, the first cap layer 20a and the second cap layer 20b may be included in a cap layer 20 (see FIG. 4).

In some embodiments, the substrate 10 may include a silicon having a surface of plane orientation of (111), for example. In some embodiments, the substrate 10 may include a sapphire or a silicon carbide.

In some embodiments, the buffer layer 12 is provided on the substrate 10. In some embodiments, the buffer layer 12 may act to relax lattice misalignment between the substrate 10 and the channel layer 14. In some embodiments, the buffer layer 12 may include aluminum nitride or aluminum gallium nitride or both.

In some embodiments, the channel layer 14 (e.g., as an electron transit layer) is provided on the buffer layer 12.

In some embodiments, the channel layer 14 may include, for example, an undoped $Al_xGa_{1-x}N$ ($0\leq X<1$) layer, more specifically undoped gallium nitride layer (GaN). In some embodiments, a thickness of the channel layer 14 may be 0.1 µm or more and 10 µm or less.

In some embodiments, the barrier layer 16 (e.g., as an electron supply layer) is provided on the channel layer 14. In some embodiments, the electron affinity of the barrier layer 16 may be smaller than that of the channel layer 14.

In some embodiments, the electron affinity may correspond to a difference in energy between a lower end of a conduction band and a vacuum level. In some embodiments, 2DEG may be formed in the channel layer because the electron affinity of the barrier layer 16 is smaller than that of the channel layer 14. In some embodiments, a band gap of the barrier layer 16 may be larger than that of the channel layer 14.

In some embodiments, the barrier layer 16 may include an undoped $Al_yGa_{1-y}N$ ($0<Y\leq1$, $X<Y$) layer, and for example, an undoped aluminum gallium nitride layer, more specifically, an undoped $Al_{0.2}Ga_{0.8}N$ layer. In some embodiments, a thickness of the barrier layer 16 may be 2 nm or more and 10 nm or less.

In some embodiments, a hetero junction interface may be provided between the channel layer 14 and the barrier layer 16. In some embodiments, the hetero junction interface may be substantially flat. In some embodiments, a surface of the channel layer 14 may be substantially flat.

In some embodiments, 2DEG may be formed due to a polarized charge in the channel layer 14. In some embodiments, a high electron mobility of 2DEG may allow for a low on-resistance of a device in operation and a high speed switching.

In some embodiments, the source electrode 26 and the drain electrode 28 are provided on the barrier layer 16. In some embodiments, the electrodes 26 and 28 may include a metal electrode, for example, a structure where at least two of titanium (Ti), aluminum (Al), nickel (Ni), gold (Au) are laminated. In some embodiments, a thickness of titanium (Ti) in the metal electrode may be 25 nm, for example. In some embodiments, a thickness of aluminum (Al) in the metal electrode may be 300 nm, for example. In some embodiments, a thickness of nickel (Ni) in the metal electrode may be 50 nm, for example. In some embodiments, a thickness of gold (Au) in the metal electrode may be 50 nm, for example.

In some embodiments, the source electrode 26 and the drain electrode 28 is in contact with the barrier layer 16, for example. In some embodiments, the source electrode 26 and the drain electrode 28 may be ohmic-contacted to the barrier layer 16. In some embodiments, the source electrode 26 and the drain electrode 28 may be electrically connected to the channel layer 14 though the barrier layer 16, or may be directly connected to (or in contact with) the channel layer 14. In some embodiments, the source electrode 26 sandwiches the gate electrode 24 with the drain electrode 28.

In some embodiments, a distance between the source electrode 26 and the drain electrode 28 may be 5 µm or more and 30 µm or less.

In some embodiments, the aluminum oxynitride layer 22 is provided on and directly connected to (or in contact with) the barrier layer 16 located between the source electrode 26 and the drain electrode 28. In some embodiments, the aluminum oxynitride layer 22 is provided between the barrier layer 16 and the gate electrode 24. In some embodiments, the aluminum oxynitride layer 22 is used as a gate insulating film of HEMT 100.

In some embodiments, the aluminum oxynitride layer 22 may include an amorphous structure. An atom ratio of nitrogen to the sum of oxygen and nitrogen (N/(O+N)) in the aluminum oxynitride layer 22 may be 0.001 or more and 0.1 or less, for example. In some embodiments, the atom ratio may be measured by an electron energy loss spectroscopy (EELS).

In some embodiments, the aluminum oxynitride layer 22 may include aluminum oxynitride as a main component and may include other materials as a sub-component. In some embodiments, a thickness of the aluminum oxynitride layer 22 may be 4 nm or more and 20 nm or less, for example.

In some embodiments, the gate electrode 24 is provided between the source electrode 26 and the drain electrode 28. In some embodiments, the aluminum oxynitride layer 22 is provided between the barrier layer 16 and the gate electrode 24.

In some embodiments, the gate electrode 24 may include a metal electrode, for example, a structure where platinum (Pt) and gold (Au) are laminated. In some embodiments, a thickness of platinum (Pt) in the metal electrode is 50 nm, for example. In some embodiments, a thickness of gold (Au) in the metal electrode is 500 nm, for example.

In some embodiments, the first aluminum nitride layer 18a may be provided on and may be contact with the barrier layer 16. In some embodiments, the first aluminum nitride layer 18a is provided between the aluminum oxynitride layer 22 and the source electrode 26. In some embodiments, the first aluminum nitride layer 18a may increase a density of 2DEG in the surface of the channel layer 14 under the first aluminum nitride layer 18a.

In some embodiments, the first aluminum nitride layer 18a may be crystalline and, for example, may include a single crystal layer. In some embodiments, the first aluminum nitride layer 18a may include aluminum nitride as a main component and may include other materials as a sub-component. In some embodiments, a thickness of the first aluminum nitride layer 18a may be 5 nm or more and 25 nm or less.

In some embodiments, the second aluminum nitride layer 18b is provided on and in contact with the barrier layer 16. In some embodiments, the second aluminum nitride layer 18b is provided between the aluminum oxynitride layer 22 and the drain electrode 28. In some embodiments, the second aluminum nitride layer 18b is between the gate electrode 24 and the drain electrode 28. In some embodiments, the second aluminum nitride layer 18b may increase a density of 2DEG in a surface of the channel layer 14 under the second aluminum nitride layer 18b.

In some embodiments, the second aluminum nitride layer 18b may be crystalline and, for example, may include a single crystal layer. In some embodiments, the second aluminum nitride layer 18b may include aluminum nitride as a main component and may include other materials as a sub-component. In some embodiments, a thickness of the second aluminum nitride layer 18b may be 5 nm or more and 25 nm or less.

In some embodiments, a difference between a distance d1 and a distance d2 (see FIG. 1) may be −1 nm or more and 1 nm or less and a difference between the distance d1 and a distance d3 (see FIG. 1) may be −1 nm or more and 1 nm or less, when the distance d1 is a distance between the aluminum oxynitride layer 22 and the barrier layer 16, the distance d2 is a distance between the first aluminum nitride layer 18a and the barrier layer 16, and the distance d3 is a distance between the second aluminum nitride layer 18b and the barrier layer 16. In some embodiments, a surface of the barrier layer 16 may be substantially flat.

In some embodiments, the first cap layer 20a is provided on the first aluminum nitride layer 18a. In some embodiments, the first cap layer 20a may include an insulating layer and may prevent an oxidation of the first aluminum nitride layer 18a.

In some embodiments, the first cap layer 20a may include an amorphous aluminum oxide layer and may have a thickness of 5 nm or more and 25 nm or less, for example.

In some embodiments, a second cap layer 20b is provided on the second aluminum nitride layer 18b. In some embodiments, the second cap layer 20b may include an insulating layer and may prevent an oxidation of the second aluminum nitride layer 18b.

In some embodiments, the second cap layer 20b may include an amorphous aluminum oxide layer and may have a thickness of 5 nm or more and 25 nm or less, for example.

Next, an example of a manufacturing method of the semiconductor device in some embodiments will be described. From FIG. 2 to FIG. 8 are a schematic cross-sectional view of the semiconductor device in the manufacturing process according to some embodiments.

In some embodiments, the manufacturing method may include forming a second nitride semiconductor have the electron affinity smaller than that of a first nitride semiconductor on the first nitride semiconductor. An aluminum nitride layer may be formed on the second nitride semiconductor. An aluminum oxynitride layer may be formed by a selective oxidation of a portion of the aluminum nitride layer. The gate electrode 24 may be formed on the aluminum oxynitride layer.

Figure 2:
FIG. 2 is a schematic cross-sectional view of the semiconductor device in a manufacturing process according to some embodiments.
Figure 3:
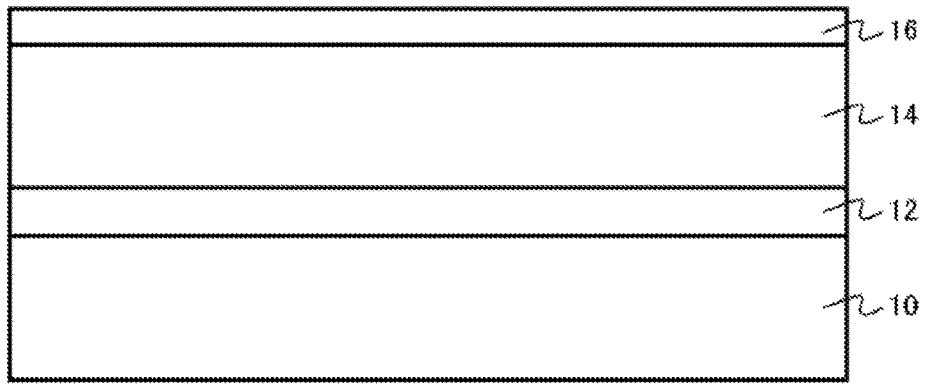
FIG. 3 is a schematic cross-sectional view of the semiconductor device in the manufacturing process according to some embodiments.

In some embodiments, first, the substrate 10, for example, the silicon substrate having the surface of a plane orientation of (111) may be prepared (see FIG. 2). Next, in some embodiments, the buffer layer 12 may be grown on the silicon substrate by an epitaxial growth. In some embodiments, the buffer layer 12 is an aluminum nitride layer, for example and grown by the metal organic chemical vapor deposition (MOCVD) method.

Figure 4:
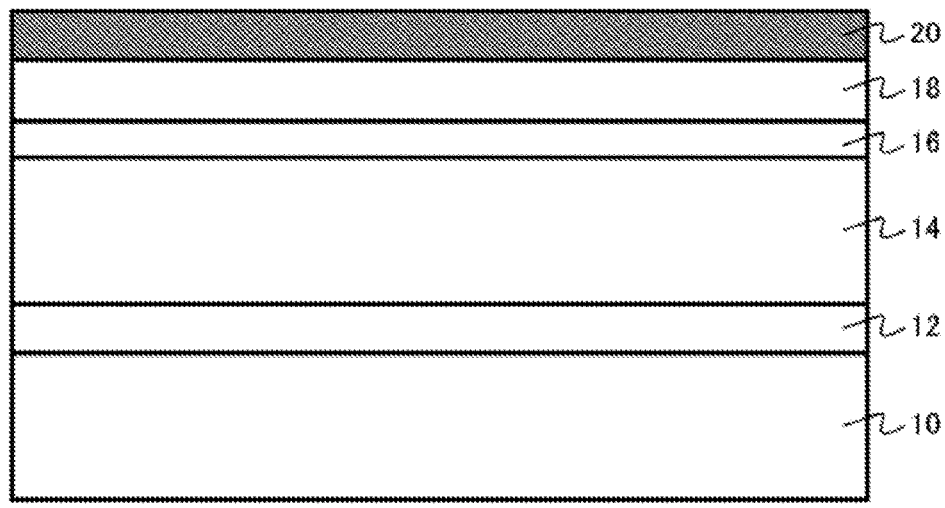
FIG. 4 is a schematic cross-sectional view of the semiconductor device in the manufacturing process according to some embodiments.

Next, in some embodiments, on the barrier layer 16, the aluminum nitride layer 18 and the aluminum oxide that becomes the cap layer 20 may be continuously deposited without being exposed to an atmospheric air by plasma enhanced atomic layer deposition (PE-ALD) method (see FIG. 4). In some embodiments, a trimethyl aluminum and an ammonia gas may be used as a material gas for a deposition of the aluminum nitride layer 18. In some embodiments, a trimethyl aluminum and a water vapor may be used as a material gas for a deposition of the aluminum oxide layer.

In some embodiments, the aluminum nitride layer 18 may be crystalline. In some embodiments, the aluminum oxide layer used as the cap layer 20 may include an amorphous structure. In some embodiments, a thickness of the aluminum nitride layer 18 may be, for example, 10 nm. In some embodiments, a thickness of the aluminum oxide layer used as the cap layer 20 may be, for example, 10 nm.

The aluminum nitride layer 18 grown by the PE-ALD method may be easily oxidized in the atmosphere. In some embodiments, the cap layer 20 may prevent the oxidation of the aluminum nitride layer 18.

In some embodiments, the aluminum nitride layer 18 may be epitaxially grown while succeeding a crystallinity of aluminum gallium nitride at the beginning of the growth. The aluminum nitride layer 18 may be epitaxially grown by the MOCVD method.

Figure 5:
FIG. 5 is a schematic cross-sectional view of the semiconductor device in the manufacturing process according to some embodiments.

Next, in some embodiments, a portion of the cap layer 20, which is located in a region where the gate electrode 24 is formed later, is selectively removed (see FIG. 5). In some embodiments, the cap layer 20 is, for example, selectively removed by a lithography method and a wet etching method. In some embodiments, a diluted hydrofluoric acid can be used for the wet etching method.

Figure 6:
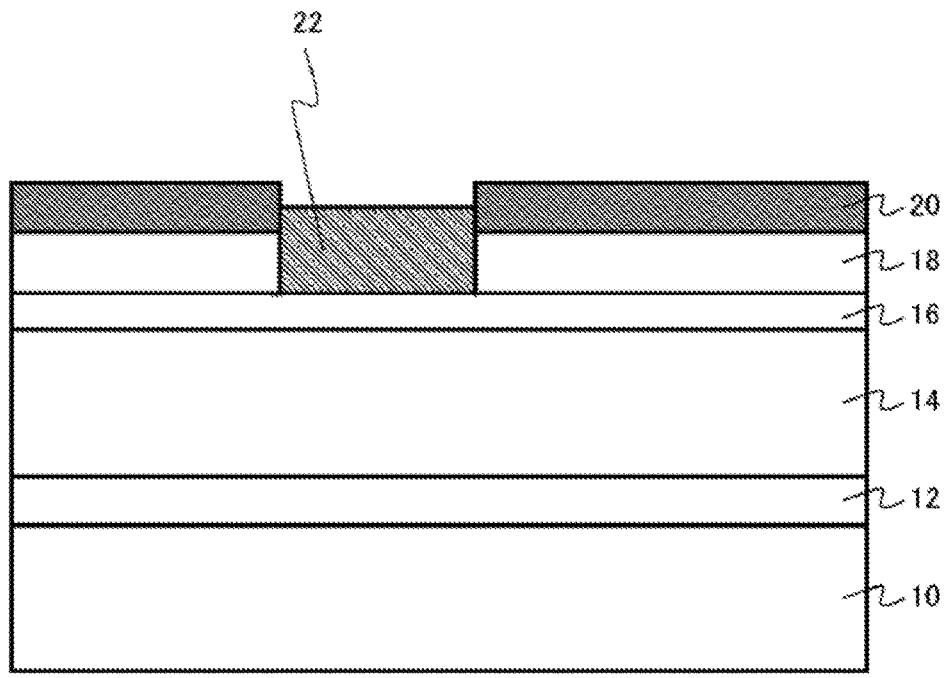
FIG. 6 is a schematic cross-sectional view of the semiconductor device in the manufacturing process according to some embodiments.

Next, in some embodiments, the aluminum oxynitride layer 22 is formed by selective oxidizing of a portion of the aluminum nitride layer 18 (see FIG. 6). In some embodiments, the aluminum nitride layer 18 which is exposed in an opening of the cap layer 18, for example, may be oxidized by using a plasma oxidation method. In some embodiments, the aluminum nitride layer 18 may be oxidized so that the aluminum oxynitride layer 22 is in contact with the barrier layer 16, for example.

Next, in some embodiments, some portions of the cap layer 20 and the aluminum nitride layer 18, which are located in a region where the source electrode 26 and the drain electrode 28 are formed later, may be selectively removed by the lithography method and the wet etching method.

Figure 7:
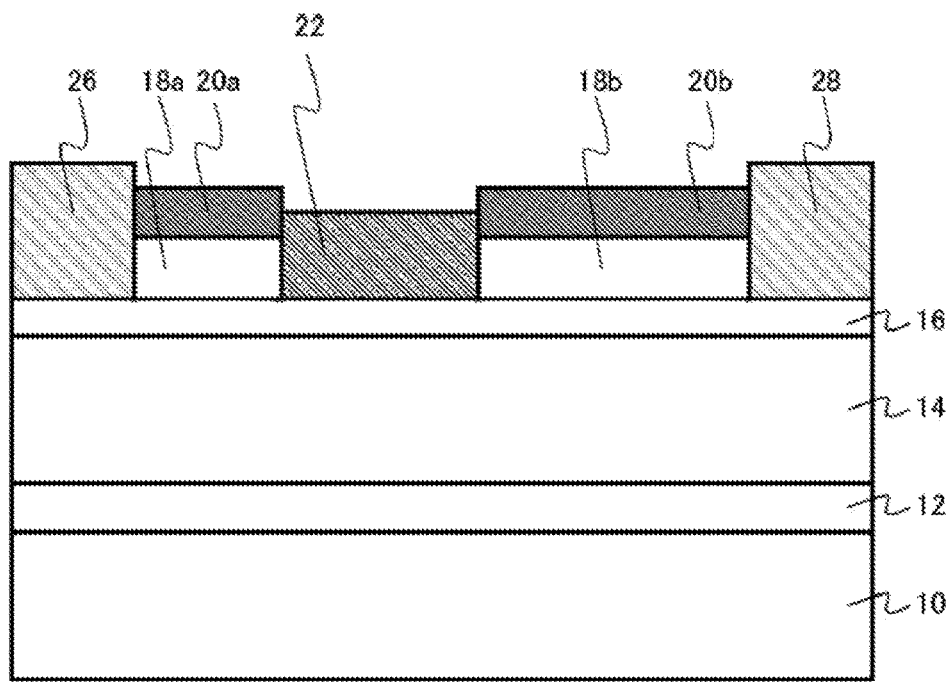
FIG. 7 is a schematic cross-sectional view of the semiconductor device in the manufacturing process according to some embodiments.

In some embodiments, the source electrode 26 and the drain electrode 28 may be formed on the barrier layer 16 by using an electron beam evaporation method and a lift-off method (see FIG. 7). In some embodiments, the source electrode 26 and the drain electrode 28 may include, for example, a structure where at least two of titanium (Ti), aluminum (Al), nickel (Ni) and gold (Au) are laminated. In some embodiments, a thickness of titanium (Ti) in the laminated structure is 25 nm. In some embodiments, a thickness of aluminum (Al) in the laminated structure is 300 nm. In some embodiments, a thickness of nickel (Ni) in the laminated structure is 50 nm. In some embodiments, a thickness of gold (Au) in the laminated structure is 50 nm.

In some embodiments, the surface of the channel layer 14 with 2DEG can be ohmic-contacted to the source electrode 26 and the drain electrode 28 by annealing the channel layer 14, the source layer 26, and the drain electrode 28 in a nitrogen atmosphere at 675 degrees Celsius and for ten minutes.

Figure 8:
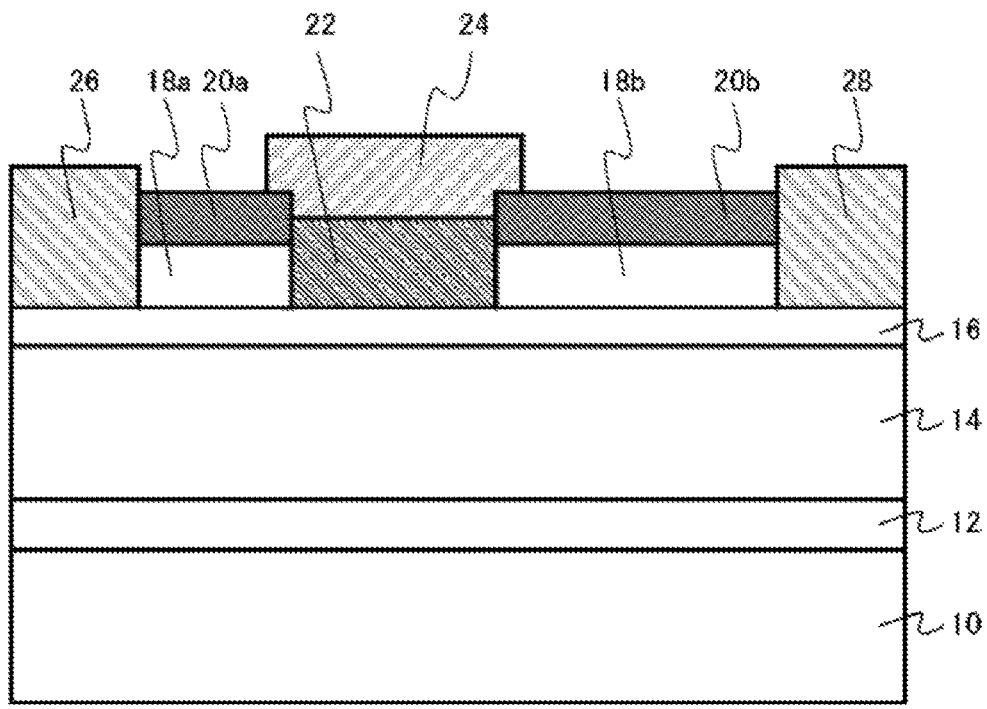
FIG. 8 is a schematic cross-sectional view of the semiconductor device in the manufacturing process according to some embodiments.

Next, in some embodiments, the gate electrode 24 is formed on the aluminum oxynitride layer 22 by using the electron beam evaporation method and the lift-off method (see FIG. 8). In some embodiments, the gate electrode 24 may include a structure where platinum (Pt) and gold (Au) are laminated. In some embodiments, a thickness of platinum (Pt) in the laminated structure is 50 nm. In some embodiments, a thickness of gold (Au) in the laminated structure is 500 nm.

Thereafter, in some embodiments, HEMT 100 shown in FIG. 1 is formed through a manufacturing process of a passivation layer, a via, a field plate, and a pad metal, and so on, which are not shown in the figures.

Next, an operation and an effect of the semiconductor device in some embodiments will be described.

In some embodiments, the surface of the channel layer 14 under the gate electrode 24 in HEMT 100 can be depleted without being applied with a voltage by thinning the thickness of the barrier layer 16 under the gate electrode 24. Therefore, HEMT 100 can be in off-state without being applied with the voltage.

In some embodiments, 2DEG can be induced or formed to the surface of the channel layer 14 under the gate electrode 24 when the gate electrode 24 is applied with a voltage higher than a threshold voltage. Thereby, in some embodiments, a current can flow between the source electrode 26 and the drain electrode 28 to become on-state in HEMT 100.

As described the above, HEMT 100 has a normally-off characteristic in some embodiments.

In some embodiments, HEMT 100 includes the aluminum oxynitride layer 22 as a gate insulating film. In some embodiments, the aluminum oxynitride layer 22 with nitrogen may include a negative fixed charge to shift the threshold voltage of HEMT 100 to a positive direction so that the threshold voltage of HEMT 100 increases to become stable in the normally-off characteristic.

In general, a leakage current in an aluminum oxynitride layer is smaller than that in a gallium oxide layer. In some embodiments, HEMT 100 can make a leakage current small or reduce a leakage current by using the aluminum oxynitride layer 22 as a gate insulating film.

In some embodiments, the surface of the channel layer 14 and the surface of the barrier layer 16 may be substantially flat between the source electrode 26 and the drain electrode 28. Therefore, in some embodiments, a scattering of the electron flowing the surface of the channel layer 14 can be suppressed to obtain a high performance HEMT 100 with a low on-resistance.

In some embodiments, HEMT 100 includes the first aluminum nitride layer 18a between the source electrode 26 and the gate electrode 24. In some embodiments, HEMT 100 includes the second aluminum nitride layer 18b between the gate electrode 24 and the drain electrode 28. In some embodiments, an amount of a polarized charge induced to or formed on the surface of the channel layer 14 under the first aluminum nitride layer 18a may increase due to the first aluminum nitride layer 18a so that the density of 2DEG in the surface of the channel layer 14 increases under the first aluminum nitride layer 18a.

In some embodiments, the density of 2DEG in the surface of the channel layer 14 under the second aluminum nitride layer 18b may increase. Therefore, in some embodiments, the low on-resistance can be maintained as a whole while the thickness of the barrier layer 16 is reduced for the normally-off characteristic.

In the manufacturing method according to some embodiments, the aluminum oxynitride layer 22 as the gate insulating film may be formed by oxidizing the aluminum nitride layer 18 to reduce an interface level density in an interface between the barrier layer 16 and the aluminum oxynitride layer 22. In some embodiments, a trap density of a film formed by an oxidation may be higher than a trap density of a deposition film to suppress a variation of the threshold value during the operation and to obtain the high performance HEMT 100.

In some embodiments, in the manufacturing method, nitrogen radicals may be supplied to the barrier layer 16 from the aluminum nitride layer 18 when the aluminum oxynitride layer 22 is formed by oxidizing the aluminum nitride layer 18 to reduce a density of a nitrogen defect in the barrier layer 16. Therefore, in some embodiments, the scattering of the electron due to the nitrogen defect can be suppressed to obtain a high performance HEMT 100 with a low on-resistance.

In some embodiments, in the manufacturing method, the aluminum oxynitride layer 22 may be formed by oxidizing the aluminum nitride layer 18. Therefore, in some embodiments, a variation of the thickness of the barrier layer 16 under the gate electrode 24 may depend on a variation of an oxidation amount of the aluminum oxynitride layer 22. In some embodiments, the variation of the thickness of the barrier layer 16 under the gate electrode 24 may lead to a variation of the threshold voltage of HEMT 100.

For example, a normally-off characteristic may be obtained by controlling a film thickness of a barrier layer under a gate electrode with dry-etching method. In some embodiments, a normally-off characteristic of HEMT may be obtained with a gate recess structure.

In general, a variation in oxidation amount between wafers and between insides of the wafer surface may be smaller than a variation in a dry-etching amount between the wafers and between insides of the wafer surface. Therefore, in some embodiments, HEMT 100 which has a small variation of the threshold voltage can be obtained.

HEMT 100 according to some embodiments can have a high reliability, a high performance, and a stable threshold voltage.

In some embodiments, the thickness of the barrier layer 16 may be 10 nm or less, more likely, 5 nm or less to realize the normally-off characteristic.

From a point of view of suppressing the scattering of the electron flowing the surface of the channel layer 14, in some embodiments, the difference between a distance d1 and a distance d2 may be −1 nm or more and 1 nm or less and the difference between the distance d1 and a distance d3 may be −1 nm or more and 1 nm or less, when the distance d1 is a distance between the aluminum oxynitride layer 22 and the barrier layer 16, the distance d2 is a distance between the first aluminum nitride layer 18a and the barrier layer 16, and the distance d3 is a distance between the second aluminum nitride layer 18b and the barrier layer 16.

In some embodiments, the atom ratio of nitrogen to the sum of oxygen and nitrogen (N/(O+N)) in the aluminum oxynitride layer 22 may be in the range of 0.001 or more and 0.1 or less, more likely, 0.01 or more and 0.1 or less. There is possibility that the threshold voltage may be too low when the ratio is lower than the above range and the leakage current may become too large when the ratio is higher than the above range.

According to some embodiments, HEMT with a high reliability, a high performance, and a stable threshold voltage, and the manufacturing method thereof can be offered.

A semiconductor device according to some embodiments is similar to the semiconductor device according to the embodiments illustrated in FIG. 1 to FIG. 8 except further including an insulating layer provided between a gate electrode and an aluminum oxynitride layer. Hereinafter, a description which is common with the embodiments illustrated in FIG. 1 to FIG. 8 may be omitted.

Figure 9:
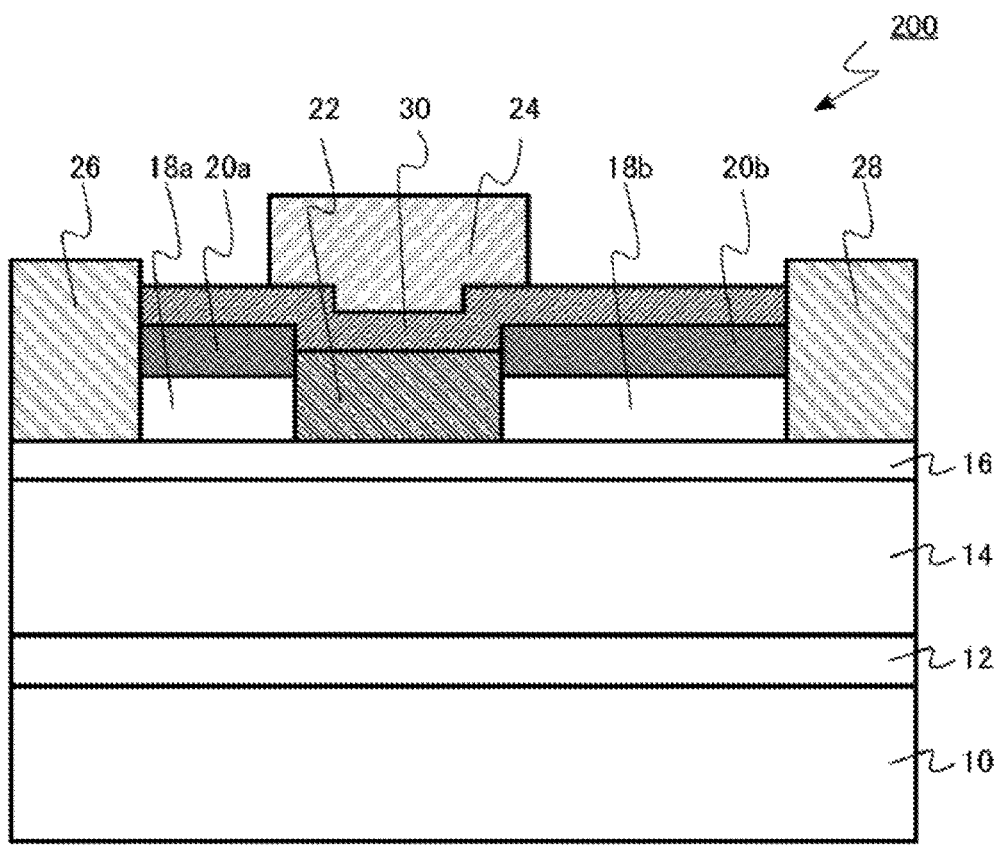
FIG. 9 is a schematic cross-sectional view of a semiconductor device according to some embodiments.

FIG. 9 is a schematic cross-sectional view of the semiconductor device according to some embodiments. The semiconductor device includes HEMT using a group III-V compound semiconductor.

In some embodiments, as shown in FIG. 9, HEMT 200 (or a semiconductor device) includes the substrate 10, the buffer layer 12, the channel layer 14 (as the first nitride semiconductor layer), the barrier layer 16 (as the second nitride semiconductor layer), the first aluminum nitride layer 18a, the second aluminum nitride layer 18b, the first cap layer 20a, the second cap layer 20b, the aluminum oxynitride layer 22, the gate electrode 24, the source electrode 26 (as the first electrode), and the drain electrode 28 (as the second electrode), and an insulating layer 30.

In some embodiments, the insulating layer 30 is provided between the gate electrode 24 and the aluminum oxynitride layer 22. In some embodiments, the aluminum oxynitride layer 22 and the insulating layer 30 may be used as the insulating layer of HEMT 200.

In some embodiments, the insulating layer 30 may include an amorphous structure and a material different from the aluminum oxynitride. In some embodiments, the insulating layer 30 includes, for example, silicon oxide, silicon nitride, oxy nitride silicon, aluminum oxide, aluminum nitride, zirconium oxide, zirconium oxynitride, hafnium oxide, hafnium oxynitride, lanthanum oxide, lanthanum oxynitride, praseodymium oxide, or praseodymium oxynitride. In some embodiments, the insulating layer 30 may include laminated layers or a mixture of the above materials.

In some embodiments, a thickness of the insulating layer 30 may be 10 nm or more and 30 nm or less.

Figure 10:
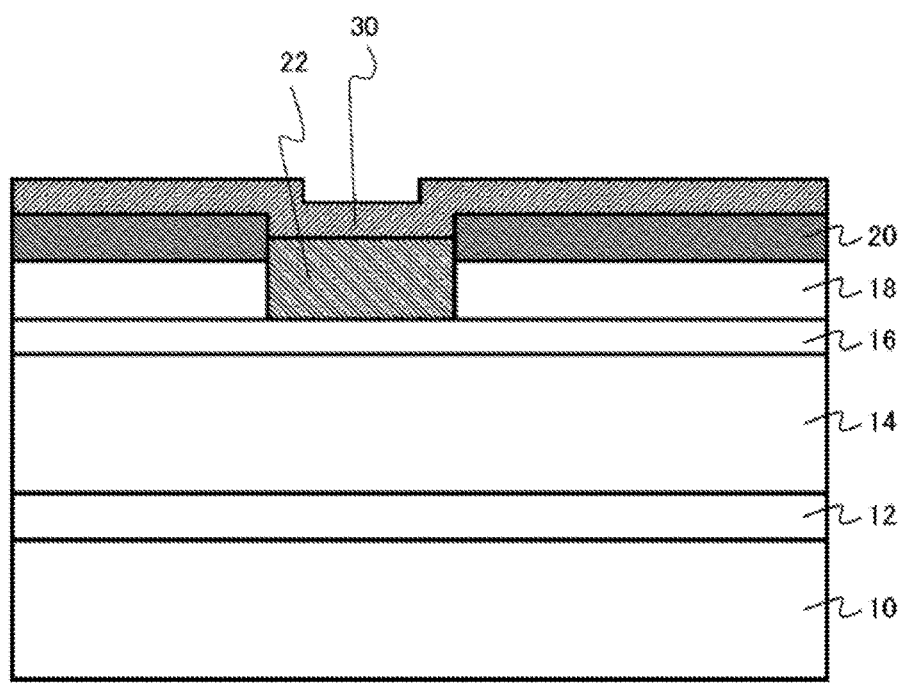
FIG. 10 is a schematic cross-sectional view of the semiconductor device in a manufacturing process according to some embodiments.

Next, an example of a manufacturing method of the semiconductor device in some embodiments will be described. From FIG. 10 to FIG. 12, schematic cross-sectional views of the semiconductor device in manufacturing processes are shown.

In some embodiments, first, the buffer layer 12, the channel layer 14, the barrier layer 16, the aluminum nitride layer 18, and the cap layer 20 are deposited on the substrate 10, and the aluminum oxynitride layer 22 is formed.

Next, in some embodiments, portions of the insulating layer 30, the cap layer 20, and the aluminum nitride layer 18 may be removed by using a lithography method and a wet etching method. Thereafter, in some embodiments, other portions of the insulating layer 30, the cap layer 20, and the aluminum nitride layer 18, which are located in a region where the source electrode 26 and the drain electrode 28 are formed later, may be selectively removed.

Figure 11:
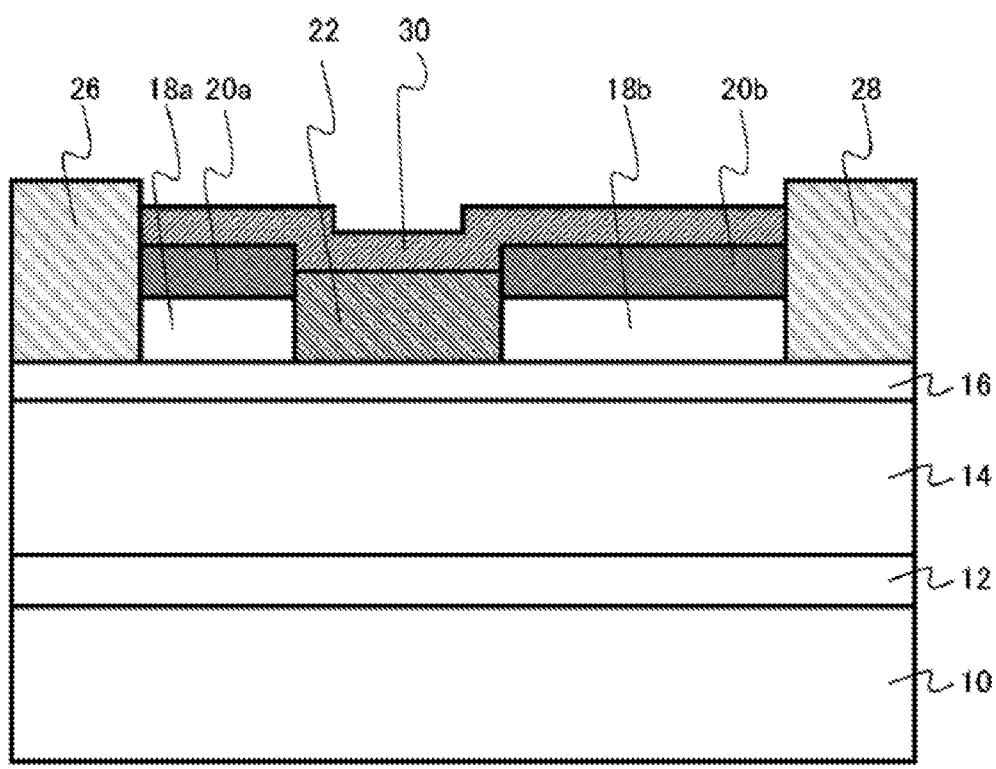
FIG. 11 is a schematic cross-sectional view of the semiconductor device in the manufacturing process according to some embodiments.

Next, in some embodiments, the source electrode 26 and the drain electrode 28 may be formed on the barrier layer 16 by using an electron beam evaporation method and a lift-off method (see FIG. 11). In some embodiments, the source electrode 26 and the drain electrode 28 may include, for example, a structure where at least two of titanium (Ti), aluminum (Al), nickel (Ni) and gold (Au) are laminated. In some embodiments, a thickness of titanium (Ti) in the laminated structure is 25 nm. In some embodiments, a thickness of aluminum (Al) in the laminated structure is 300 nm. In some embodiments, a thickness of nickel (Ni) in the laminated structure is 50 nm. In some embodiments, a thickness of gold (Au) in the laminated structure is 50 nm.

In some embodiments, the surface of the channel layer 14 with 2DEG can be ohmic-contacted to the source electrode 26 and the drain electrode 28 by annealing the channel layer 14, the source layer 26, and the drain electrode 28 in a nitrogen atmosphere at 675 degrees Celsius and for ten minutes.

Figure 12:
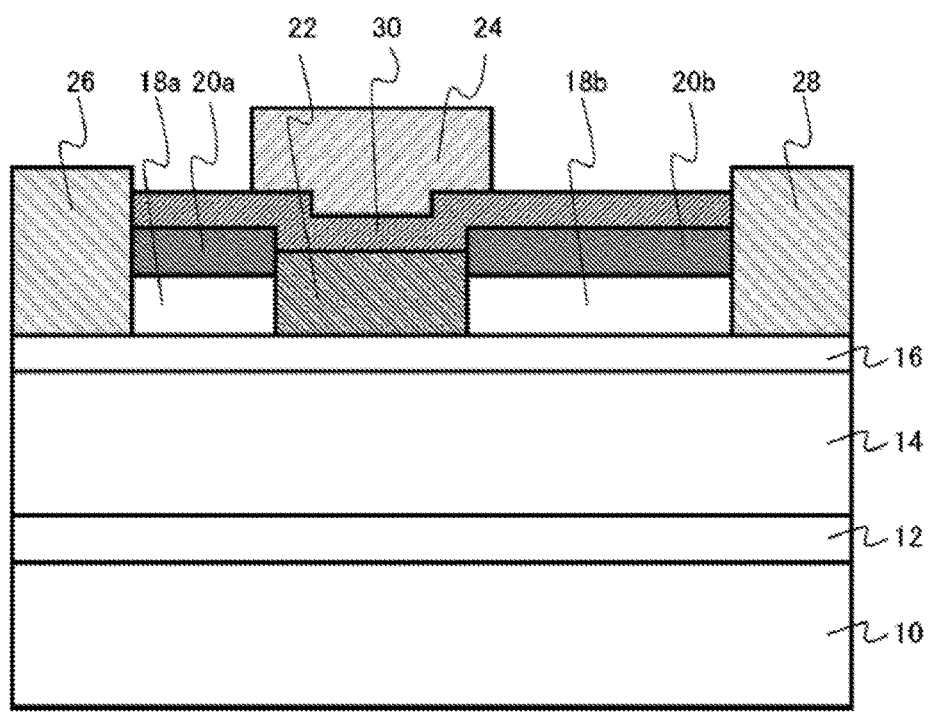
FIG. 12 is a schematic cross-sectional view of the semiconductor device in the manufacturing process according to some embodiments.

Next, in some embodiments, the gate electrode 24 may be formed on the insulating layer 30 by using an electron beam evaporation method and a lift-off method (see FIG. 12). In some embodiments, the gate electrode 24 may include a structure where platinum (Pt) and gold (Au) are laminated. In some embodiments, a thickness of platinum (Pt) in the laminated structure is 50 nm. In some embodiments, a thickness of gold (Au) in the laminated structure is 500 nm.

Thereafter, in some embodiments, HEMT 200 shown in FIG. 9 may be formed through the manufacturing process of a passivation layer, a via, a field plate, and a pad metal, and so on, which are not shown in the figures.

In some embodiments, the thickness of the gate insulating film in HEMT 200 may become larger due to an addition of the insulating layer 30. Therefore, in some embodiments, an electric field applied to the gate insulating film can be reduced and a withstand voltage of the gate insulating film can be improved to obtain a high performance HEMT 200.

According to some embodiments, HEMT with a high reliability, a high performance, and a stable threshold voltage, and the manufacturing method thereof can be offered as the same as the embodiments illustrated in FIG. 1 to FIG. 8. In some embodiments, HEMT with a higher performance than the embodiments illustrated in FIG. 1 to FIG. 8 and the manufacturing method thereof can be obtained by improving of the withstand voltage in the gate insulating film.

In some embodiments, the material of the nitride semiconductor layer may include gallium nitride and aluminum gallium nitride as may be applicable. In some embodiments, the material of the nitride semiconductor layer may include indium gallium nitride including indium (In), aluminum indium nitride, or aluminum indium gallium nitride are applicable. In some embodiments, the material of the nitride semiconductor layer may include aluminum nitride.

In some embodiments, the barrier layer 16 may include undoped aluminum gallium nitride layer. In some embodiments, the barrier layer 16 may include n-type aluminum gallium nitride layer.

While certain embodiments have been described, these embodiments have been presented by way of example only, and are not intended to limit the scope of the present disclosure. Indeed, the methods and systems described herein may be embodied in a variety of other forms; furthermore, various omissions, substitutions and changes in the form of the methods and systems described herein may be made without departing from the spirit of the present disclosure. The accompanying claims and their equivalents are intended to cover such forms or modifications as would fall within the scope and spirit of the present disclosure.

The invention claimed is:

1. A manufacturing method of a semiconductor device comprising:
    forming a first nitride semiconductor layer;
    forming, on the first nitride semiconductor layer, a second nitride semiconductor layer having an electron affinity lower than an electron affinity of a first nitride semiconductor layer;
    forming an aluminum nitride layer directly in contact with the second nitride semiconductor layer;
    forming an aluminum oxynitride layer by selectively oxidizing a portion of the aluminum nitride layer such that the aluminum oxynitride layer is in direct contact with second nitride semiconductor layer, and the second nitride semiconductor layer is sandwiched between the aluminum oxynitride layer and the first nitride semiconductor layer; and
    forming a gate electrode on the aluminum oxynitride layer.

2. The manufacturing method of the semiconductor device according to claim 1, wherein
    the aluminum oxynitride layer is oxidized to be in contact with the second nitride semiconductor layer.